US012660214B2

(12) United States Patent
Na et al.

(10) Patent No.: US 12,660,214 B2
(45) Date of Patent: Jun. 16, 2026

(54) CAPACITOR AND SEMICONDUCTOR DEVICE INCLUDING THE CAPACITOR

(71) Applicant: Samsung Electronics Co., Ltd., Suwon-si (KR)

(72) Inventors: Byunghoon Na, Suwon-si (KR); Jooho Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 824 days.

(21) Appl. No.: 17/882,788

(22) Filed: Aug. 8, 2022

(65) Prior Publication Data

US 2023/0231004 A1 Jul. 20, 2023

(30) Foreign Application Priority Data

Jan. 19, 2022 (KR) ........................ 10-2022-0008131

(51) Int. Cl.
H10D 1/68 (2025.01)
H01G 4/008 (2006.01)
(Continued)

(52) U.S. Cl.
CPC ............. H10D 1/696 (2025.01); H01G 4/008 (2013.01); H01G 4/33 (2013.01); H10B 12/315 (2023.02);
(Continued)

(58) Field of Classification Search
CPC ........ H10D 1/696; H10D 1/682; H10D 1/694; H10D 1/716; H01G 4/008; H01G 4/33;

H01G 4/1209; H01G 4/1227; H01G 4/1236; H01G 4/1254; H10B 12/315; H10B 12/318; H10B 12/34; H10B 12/30;
(Continued)

(56) References Cited

U.S. PATENT DOCUMENTS 3,561,106 A * 2/1971 McGee .................. H01C 7/025
                                                                    438/918
4,363,958 A * 12/1982 Kobayashi .............. F02N 19/04
                                                                    219/205
(Continued)

FOREIGN PATENT DOCUMENTS

JP        H11-204745 A        7/1999
JP        2008-124329 A        5/2008
(Continued)

OTHER PUBLICATIONS

Extended European Search Report issued Jun. 16, 2023 in European Application No. 22193898.8.
(Continued)

*Primary Examiner* — William B Partridge
*Assistant Examiner* — Linda J. Fleck
(74) *Attorney, Agent, or Firm* — Harness, Dickey & Pierce, P.L.C.

(57) ABSTRACT
Provided are a capacitor and a semiconductor device including the same. The capacitor includes: a dielectric layer having a perovskite crystal structure; and first and second electrodes spaced apart from each other with the dielectric layer therebetween. At least one of the first and second electrodes includes a metallic layer having a perovskite crystal structure, a first ionic layer having ionic properties, and a semiconductor layer.

26 Claims, 16 Drawing Sheets

<u>100</u>

(51) Int. Cl.

| | | |
|---|---|---|
| *H01G 4/12* | (2006.01) | |
| *H01G 4/33* | (2006.01) | |
| *H10B 12/00* | (2023.01) | |
| *H10B 63/00* | (2023.01) | |
| *H10N 70/00* | (2023.01) | |

(52) U.S. Cl.
CPC ........... *H10B 12/318* (2023.02); *H10B 63/30* (2023.02); *H10D 1/682* (2025.01); *H10D 1/694* (2025.01); *H10N 70/8416* (2023.02); *H01G 4/1209* (2013.01); *H01G 4/1227* (2013.01); *H01G 4/1236* (2013.01); *H01G 4/1254* (2013.01); *H10B 12/34* (2023.02); *H10N 70/8836* (2023.02)

(58) Field of Classification Search
CPC .... H10B 63/30; H10B 53/30; H10N 70/8416; H10N 70/8836; H10N 70/20; H10N 70/826; H10N 70/841; H01L 23/642
See application file for complete search history.

(56) References Cited

U.S. PATENT DOCUMENTS

| | | | | |
|---|---|---|---|---|
| 5,516,363 | A * | 5/1996 | Azuma | ............... C23C 18/1275 |
| | | | | 106/287.18 |
| 6,198,119 | B1 * | 3/2001 | Nabatame | .............. H10D 1/682 |
| | | | | 257/295 |
| 6,468,858 | B1 * | 10/2002 | Lou | ........................ H10D 1/696 |
| | | | | 257/E21.018 |
| 10,319,806 | B2 | 6/2019 | Rodriguez et al. | |
| 2004/0141390 | A1 * | 7/2004 | Won | ......................... H10D 1/68 |
| | | | | 257/E21.267 |
| 2004/0238861 | A1 * | 12/2004 | Hwang | .................. H10D 1/696 |
| | | | | 257/295 |
| 2007/0029592 | A1 | 2/2007 | Ramesh | |
| 2007/0126045 | A1 * | 6/2007 | Choi | .................... H10D 64/033 |
| | | | | 257/E21.208 |
| 2008/0265235 | A1 * | 10/2008 | Kamigaichi | .......... H10B 63/30 |
| | | | | 257/E47.001 |
| 2010/0255611 | A1 | 10/2010 | Wang | |
| 2012/0281451 | A1 * | 11/2012 | Jiang | ..................... H10N 70/20 |
| | | | | 257/43 |
| 2017/0033174 | A1 | 2/2017 | Rodriguez et al. | |
| 2018/0286586 | A1 * | 10/2018 | Jung | .................... C04B 35/495 |
| 2018/0366539 | A1 * | 12/2018 | Ergen | .................... B01J 23/002 |
| 2020/0176552 | A1 | 6/2020 | Chang et al. | |
| 2023/0094616 | A1 * | 3/2023 | Iino | ........................ H01G 4/008 |
| | | | | 361/311 |

FOREIGN PATENT DOCUMENTS

| | | | |
|---|---|---|---|
| KR | 10-2003-0058817 | A | 7/2003 |
| KR | 10-2011-0060749 | A | 6/2011 |
| KR | 10-2295353 | B1 | 9/2021 |
| WO | WO-2019005143 | A1 * | 1/2019 |

OTHER PUBLICATIONS

HoN yung Lee et al, "Thermal stability of epitaxial SrRuO3 films as a function of oxygen pressure," Appl. Phys. Lett. 84, vol. 84, No. 20, pp. 4107-4109, May 5, 2004.

Junsoo Shin et al, "Surface stability of epitaxial SrRuO3 films" Surface Science 581,Mar. 13, 2005, 118-132.

Marcos Verissimo-Alves et al, "Highly Confined Spin-Polarized Two-Dimensional; Electron Gas in SrTiO3=SrRuO3 Superlattices," Physical Review Letter, 108, 107003, Mar. 5, 2012.

* cited by examiner

CAPACITOR AND SEMICONDUCTOR DEVICE INCLUDING THE CAPACITOR

CROSS-REFERENCE TO RELATED APPLICATION

This application is based on and claims priority under 35 U.S.C. § 119 to Korean Patent Application No. 10-2022-0008131, filed on Jan. 19, 2022, in the Korean Intellectual Property Office, the disclosure of which is incorporated by reference herein in its entirety.

BACKGROUND

1. Field

The present disclosure relates to a capacitor and a semiconductor device including the capacitor.

2. Description of the Related Art

Semiconductor devices, such as memories and transistors, are used in various household and industrial devices. As the performance of the household and industrial devices improves, the degree of integration and miniaturization of semiconductor devices is progressing.

According to the degree of integration and miniaturization of semiconductor devices, the size of semiconductor devices is reduced. For example, because the capacitance of a capacitor decreases and leakage current increases as the size of the capacitor decreases, various methods are proposed to solve this problem.

SUMMARY

Provided is an electrode that stably maintains a perovskite crystal structure.

Provided is a dielectric layer that stably maintains a perovskite crystal structure.

Provided is a dielectric layer having a high dielectric constant.

Provided is a capacitor having improved capacitance characteristics.

Provided is a semiconductor device including a capacitor having improved capacitance characteristics.

However, the problem to be solved is not limited to the above disclosure.

Additional aspects will be set forth in part in the description which follows and, in part, will be apparent from the description, or may be learned by practice of the presented embodiments of the disclosure.

According to an aspect of an embodiment, a capacitor includes a first electrode; a second electrode spaced apart from the first electrode; and a dielectric layer having a perovskite crystal structure between the first and second electrodes, wherein at least one of the first and second electrodes includes a metallic layer having a perovskite crystal structure, a first ionic layer having ionic properties, and a semiconductor layer, and wherein the metallic layer, the first ionic layer, and the semiconductor layer are sequentially arranged in a direction away from the dielectric layer.

Also, the metallic layer may have an $A1B1O_3$ (O: oxygen) composition, and B1 may be a metal.

In addition, the metallic layer may include at least one of $BaRuO_3$, $BaMoO_3$, $BaIrO_3$, $BaVO_3$, $SrRuO_3$, $SrMoO_3$, $SrIrO_3$, and/or $SrVO_3$.

Also, a thickness of the metallic layer may be 50 Å or less.

In addition, the semiconductor layer may include a dielectric material having a perovskite crystal structure as a base material and a metal dopant.

Also, the dielectric material may be the same as a dielectric material of the dielectric layer.

In addition, the metal dopant may be at least one of La, Nb, Y, Fe, Cr, Ta, Co, and/or Sc.

Also, a thickness of the semiconductor layer may be greater than a thickness of the metallic layer.

In addition, a thickness of the semiconductor layer may be five times or more a thickness of the metallic layer.

Also, a thickness of the semiconductor layer may be within a range of about 100 Å to about 300 Å.

In addition, the first ionic layer may have cationic properties.

Also, the first ionic layer may have a perovskite crystal structure.

In addition, the first ionic layer may include a positive ionic layer having the cationic properties and a first neutral layer having neutral properties.

Also, the first ionic layer may include an $A3B3O_3$ (O: oxygen) composition, A3 may be a trivalent or higher valency cation, and B3 may be a tetravalent cation.

In addition, at least one of cations of the first ionic layer may be the same as cations of at least one of the semiconductor layer and the metallic layer.

Also, the first ionic layer may include at least one of $LaTiO_3$, $SmTiO_3$, $YTiO_3$, $DyTiO_3$, and/or $SmTiO_3$.

In addition, the capacitor may further include at least one second ionic layer between the dielectric layer and at least one of the first and second electrodes, the second ionic layer having different ionic properties from the first ionic layer.

Also, the second ionic layer may have a perovskite crystal structure.

In addition, the second ionic layer may include a negative ionic layer having anionic properties and a second neutral layer having neutral properties.

Also, the second ionic layer may include an $A4B4O_3$ (O: oxygen) composition, A4 may be a monovalent or higher valency cation, and B4 may be a tetravalent cation.

In addition, the second ionic layer may include at least one of $LiTiO_3$, $NaTiO_3$, $KTiO_3$, $RbTiO_3$, $LiZrO_3$, $NaZrO_3$, $KZrO_3$, $RbZrO_3$, $LiHfO_3$, $NaHfO_3$, $KHfO_3$, and/or $RbHfO_3$.

Also, the dielectric layer may include at least one of $BaTiO_3$, $KNbO_3$, $KTaO_3$, $PbTiO_3$, $PbZrO_3$, $SrTiO_3$, $CaTiO_3$, $SrHfO_3$, and/or $SrZrO_3$.

In addition, the dielectric layer may have a superlattice structure in which two or more dielectric materials having different dielectric characteristics from each other are repeatedly stacked.

According to another aspect of an embodiment, a semiconductor device includes the capacitor described above.

Also, the semiconductor device may further include a transistor, wherein the capacitor may be electrically connected to the transistor.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
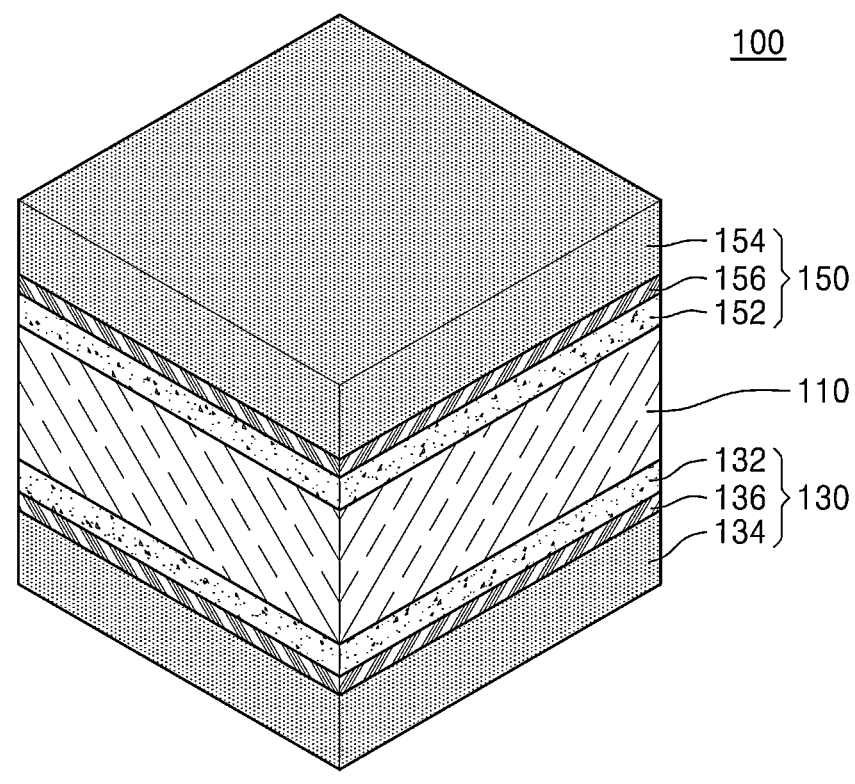
FIG. 1 is a diagram of a capacitor having a perovskite crystal structure according to at least one example embodiment.

Reference will now be made in detail to some example embodiments, examples of which are illustrated in the accompanying drawings, wherein like reference numerals refer to like elements throughout and sizes of components in the drawings may be exaggerated for clarity and convenience of explanation. The present disclosure may, however, be embodied in many different forms and should not be construed as being limited to the example embodiments set forth herein. In this regard, the present embodiments may have different forms and should not be construed as being limited to the descriptions set forth herein. Accordingly, the examples embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

In the case where a position relationship between two items is described with the terms "on ~," "on the top of ~," and/or the like, the items may be in direct or indirect contact. An expression used in the singular encompasses the expression of the plural, unless it has a clearly different meaning in the context. When a portion "includes" an element, another element may be further included, rather than excluding the existence of the other element, unless otherwise described. The use of the terms "a" and "an" and "the" and similar referents are to be construed to cover both the singular and the plural.

When the terms "about" or "substantially" are used in this specification in connection with a numerical value, it is intended that the associated numerical value includes a manufacturing tolerance (e.g., ±10%) around the stated numerical value. Further, regardless of whether numerical values are modified as "about" or "substantially," it will be understood that these values should be construed as including a manufacturing or operational tolerance (e.g., ±10%) around the stated numerical values.

FIG. 1 is a diagram of a capacitor 100 having a perovskite crystal structure according to at least one example embodiment. Referring to FIG. 1, the capacitor 100 may include a dielectric layer 110 having a perovskite crystal structure, and first and second electrodes 130 and 150 spaced apart from each other with the dielectric layer 110 therebetween. For example, the dielectric layer 110 may electrically insulate the first and second electrodes 130 and 150 from each other.

The thickness of the dielectric layer 110 may be, for example, about 5 nm to about 100 nm, and/or about 10 nm to about 100 nm. When the thickness of the dielectric layer 110 is excessively increased, the capacitance per unit volume of the capacitor 100 may be reduced. In addition, when the thickness of the dielectric layer 110 is too thin, a ratio of a dielectric constant lowering area of an interface between the dielectric layer 110 and the first electrode 130 and/or between the dielectric layer 110 and the second electrode 150 increases, and thus, the capacitance per unit volume of the capacitor 100 may be reduced.

The dielectric layer 110 may include a dielectric material having a perovskite crystal structure. The perovskite crystal structure may have an $A1B1O_3$ (O: oxygen) composition. In the composition having the perovskite crystal structure, A1 may be arranged at a cuboctahedral site coordinated with twelve oxygen atoms, and B1 may be arranged at an octahedral site coordinated to six oxygen atoms. The dielectric layer 110 may include a ternary oxide ($ABO_3$) having a perovskite crystal structure including A1 as a divalent cation and B1 as a tetravalent cation.

The dielectric layer 110 may have a ferroelectric characteristic or a paraelectric characteristic. When the dielectric layer 110 has a ferroelectric characteristic, the dielectric layer 110 may include, for example, $BaTiO_3$, $KNbO_3$, $KTaO_3$, $PbTiO_3$, and/or $PbZrO_3$. When the dielectric layer 110 has a paraelectric characteristic, the dielectric layer 110 may include, for example, $SrTiO_3$, $CaTiO_3$, $SrHfO_3$, and/or $SrZrO_3$. However, the oxide included in the dielectric layer 110 is not limited thereto, and a perovskite ternary oxide including other cations is also possible.

Figure 17:
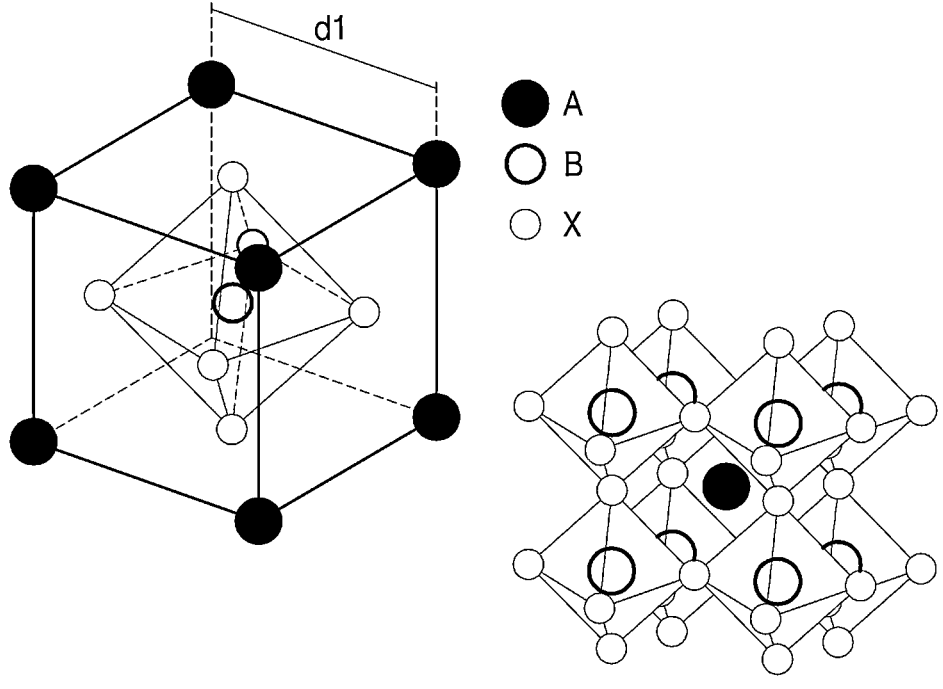
FIG. 17 schematically illustrates the structure of a perovskite material.

FIG. 17 schematically illustrates the structure of a perovskite material.

Referring to FIGS. 1 and 17, a material having a perovskite crystal structure of a ABO3 (e.g., the A1B1O3) composition may have a dielectric characteristic greatly influenced by a composition ratio between the A and B materials, and a crystalline state such as A-O, O-B-O bonding states. For example, when the crystallinity of the dielectric layer 110 is low, the dielectric characteristic thereof may be deteriorated.

The crystallinity of the dielectric layer 110 may be affected by the crystallinity of the first and second electrodes 130 and 150 adjacent to the dielectric layer 110. For example, when the crystallinity of the first and second electrodes 130 and 150 is low and/or of a substantially different type to the dielectric layer 110, the crystallinity of the dielectric layer 110 may also be low, and when the crystallinity of the first and second electrodes 130 and 150 is high and/or a similar type to the dielectric layer 110, the crystallinity of the dielectric layer 110 may also be high. Accordingly, the first and second electrodes 130 and 150 preferably have high crystallinity to stably maintain a high dielectric constant of the dielectric layer 110.

For example, when a noble metal, such as Ru, Ir, Pt, Au, and/or the like, is used as an electrode, the noble metal does not have a perovskite crystal structure, and thus, the dielectric layer 110 may not maintain the perovskite crystal structure, and the dielectric characteristic of the dielectric layer 110 may be deteriorated.

The first electrode 130 according to at least one example embodiment may include a metallic layer 132 having a perovskite crystal structure. The metallic layer 132 may have metallic characteristics such as a metallic electrical property (e.g., may have no band gap and/or a zero-gap band gap) and may have an A2B2O$_3$ composition. Metal elements such as Ru, Mo, Ir, V, and/or the like may be included in a B2-site of the A2B2O$_3$ composition. For example, the metallic layer 132 may include at least one of BaRuO$_3$, BaMoO$_3$, BaIrO$_3$, BaVO$_3$, SrRuO$_3$, SrMoO$_3$, SrIrO$_3$, SrVO$_3$, and/or the like. As the metallic layer 132 has a high conductivity metallic characteristic while having a low specific resistance, the metallic layer 132 may function as an electrode of the capacitor 100.

On the other hand, the metal materials included in the metallic layer 132, which is ternary, may have various valences, and may be difficult to maintain a stable perovskite crystal structure due to weak oxidizing power thereof. For example, Ru has a low electrical resistance and high work-function, which may be suitable as an electrode of the capacitor 100. However, because the oxidation and reduction reactivity of a Ru material is high, the Ru material may be easily transition into a crystal other than the perovskite crystal structure. Furthermore, even when the metallic layer 132 including Ru forms a perovskite crystal structure, the perovskite crystal structure may be easily collapsed by an operation environment including vacuum, high temperature, oxygen partial pressure, and/or the like. As a result, an interface between the dielectric layer 110 and the metallic layer 132 and the crystallinity of the dielectric layer 110 may be deteriorated.

Because of the instability of the metallic layer 132, the thickness of the metallic layer 132 is preferably thin. For example, the metallic layer 132 may be a single layer (e.g., a layer including a thickness of a unit cell of the perovskite crystal structure). However, the present disclosure is not limited thereto. The metallic layer 132 may include a plurality of layers. Even when the metallic layer 132 includes a plurality of layers, the thickness of the metallic layer 132 may be about 50 Å or less. When the thickness of the metallic layer 132 is reduced, the specific resistance of the metallic layer 132 may increase.

The first electrode 130 according to at least one example embodiment may further include a semiconductor layer 134. The semiconductor layer 134 may have a form in which a base material of a dielectric material is doped with a metal element and/or material. The base material of the semiconductor layer 134 may have the same perovskite crystal structure as the crystal structure of the metallic layer 132, and thus, the crystallinity of the metallic layer 132 may be stabilized. According to at least one example embodiment, the base material of the semiconductor layer 134 may be the same as the dielectric material included in the dielectric layer 110. For example, the semiconductor layer 134 may include at least one of BaTiO$_3$, KNbO$_3$, KTaO$_3$, PbTiO$_3$, PbZrO$_3$, SrTiO$_3$, CaTiO$_3$, SrHfO$_3$, and/or SrZrO$_3$.

A dopant doped in the semiconductor layer 134 may be a metal element and/or material. For example, the dopant may include at least one of La, Nb, Y, Fe, Cr, Ta, Co, and/or Sc. The semiconductor layer 134 may prevent (or mitigate) a specific resistance of the first electrode 130 from increasing due to the metallic layer 132 having a thin thickness. Also, the work-function of the first electrode 130 may be increased by the semiconductor layer 134.

As the semiconductor layer 134 prevents (or mitigates) the specific resistance of the metallic layer 132 having a thin thickness from increasing, the thickness of the semiconductor layer 134 may be greater than the thickness of the metallic layer 132. In at least one example embodiment, the thickness of the semiconductor layer 134 may be five times or more the thickness of the metallic layer 132. For example, the thickness of the semiconductor layer 134 may be about 100 Å to about 300 Å.

As the semiconductor layer 134 functions as a supplementary electrode compared to the metallic layer 132, the semiconductor layer 134 may be arranged farther from the dielectric layer 110 compared to the metallic layer 132. For example, the metallic layer 132 may be arranged between the semiconductor layer 134 and the dielectric layer 110.

When the semiconductor layer 134 and the metallic layer 132 are directly bonded to each other, a depleted layer may be formed between the semiconductor layer 134 and the metallic layer 132. The depleted layer may form a parasitic capacitance that may reduce a total capacitance of the capacitor 100.

The first electrode 130 according to an embodiment may further include a first ionic layer 136 that forms an ohmic contact between the semiconductor layer 134 and the metallic layer 132.

The first ionic layer 136 may also have a perovskite crystal structure, which may stabilize the crystallinity of the dielectric layer 110 and the first electrode 130. The perovskite crystal structure may have an A3B3O$_3$ (O: oxygen) composition. In the composition having the perovskite crystal structure, A3 may be arranged at a cuboctahedral site coordinated with twelve oxygen atoms, and B3 may be arranged at an octahedral site coordinated to six oxygen atoms.

The first ionic layer 136 may have cationic properties as a whole. For example, the first ionic layer 136 may include a positive ionic layer expressed as [A3O]$^{n+}$ and a neutral layer expressed as [B3O$_2$]; and/or A3 may be a trivalent or higher valency cation, and B3 may be a tetravalent cation. Alternatively, the first ionic layer 136 may include a neutral layer expressed as [A3O] and a positive ionic layer expressed as [B3O$_2$]$^{n+}$; and/or A3 may be a divalent cation, and B3 may be a pentavalent cation.

At least one of the cations included in the first ionic layer 136 may be the same as those included in the semiconductor layer 134 and/or the metallic layer 132. A lattice size of the first ionic layer 136 may be similar to a lattice size of the semiconductor layer 134 and/or the metallic layer 132, and thus, the crystallinity (and/or stability) of the first electrode 130 may be increased. In at least one example embodiment, the first ionic layer 136 may include at least one of LaTiO$_3$, SmTiO$_3$, YTiO$_3$, DyTiO$_3$, and SmTiO$_3$. However, the example embodiments are not limited thereto, and it is sufficient as long as an ionic layer is a material having a perovskite structure while having cationic properties as a whole.

As the first ionic layer 136 is inserted between the metallic layer 132 and the semiconductor layer 134, an interface dipole may be generated between the metallic layer 132 and the semiconductor layer 134 to induce a screening charge. For example, as the first ionic layer 136 has cationic properties, a negative screening charge is induced, and thus, a Schottky barrier between the semiconductor layer 134 and the metallic layer 132 may be reduced.

The Schottky barrier due to a junction between the semiconductor layer 134 and the metallic layer 132 may be reduced by the first ionic layer 136, and thus, an ohmic contact between the semiconductor layer 134 and the metallic layer 132 may be formed. Due to the ohmic contact, a decrease in conductivity of the metallic layer 132 due to a decrease in the thickness of the metallic layer 132 may be lessened and/or prevented. In addition, as the semiconductor layer 134 may increase the crystallinity and/or stability of the metallic layer 132, the semiconductor layer 134 may reduce the diffusion of the metal material of the metallic layer 132 into the dielectric layer 110, thereby preventing crystal degradation of the dielectric layer 110. Accordingly, the dielectric characteristic of the dielectric layer 110 may be improved.

As the first ionic layer 136 is configured to form an ohmic contact between the semiconductor layer 134 and the metallic layer 132, the thickness of the first ionic layer 136 is preferably thin. The first ionic layer 136 may be a single layer. For example, the first ionic layer 136 may be a single layer in which one positive ionic layer and one neutral layer are three-dimensionally coupled. However, the present disclosure is not limited thereto. The first ionic layer 136 may include a plurality of layers. Even when the first ionic layer 136 includes a plurality of layers, the thickness of the first ionic layer 136 may be less than the thickness of the metallic layer 132 and the thickness of the semiconductor layer 134. For example, the thickness of the first ionic layer 136 may be about 10 Å or less.

Like the first electrode 130, the second electrode 150 according to at least one example embodiment may also include a metallic layer 152 having a perovskite crystal structure, a semiconductor layer 154, and a first ionic layer 156 having ionic properties. The metallic layer 152, the first ionic layer 156, and the semiconductor layer 154 may be sequentially arranged in a direction away from the dielectric layer 110. The description of the metallic layer 152, the first ionic layer 156, and the semiconductor layer 154 of the second electrode 150 may be respectively the same as the description of the metallic layer 132, the first ionic layer 136, and the semiconductor layer 134 of the first electrode 130.

For example, the metallic layer 152 may have an $A2B2O_3$ composition. Metal elements such as Ru, Mo, Ir, V, and/or the like may be included in a B2-site of the $A2B2O_3$ composition. For example, the metallic layer 152 may include at least one of $BaRuO_3$, $BaMoO_3$, $BaIrO_3$, $BaVO_3$, $SrRuO_3$, $SrMoO_3$, $SrIrO_3$, and/or $SrVO_3$. As the metallic layer 152 has a high conductivity metallic characteristic while having a low specific resistance, the metallic layer 132 may function as an electrode of the capacitor 100.

The semiconductor layer 154 may have a form in which a base material of a dielectric material is doped with a metal element and/or material. The base material of the semiconductor layer 154 may have the same perovskite crystal structure as the crystal structure of the metallic layer 152, and thus, the crystallinity of the metallic layer 152 may be stabilized. According to at least one example embodiment, the base material of the semiconductor layer 154 may be the same as the dielectric material included in the dielectric layer 110. For example, the semiconductor layer 154 may include at least one of $BaTiO_3$, $KNbO_3$, $KTaO_3$, $PbTiO_3$, $PbZrO_3$, $SrTiO_3$, $CaTiO_3$, $SrHfO_3$, and/or $SrZrO_3$.

A dopant doped in the semiconductor layer 154 may be a metal element and/or material. For example, the dopant may include at least one of La, Nb, Y, Fe, Cr, Ta, Co, and/or Sc. The thickness of the semiconductor layer 154 may be greater than the thickness of the metallic layer 152. For example, the thickness of the semiconductor layer 154 may be five times or more the thickness of the metallic layer 152. For example, the thickness of the semiconductor layer 154 may be about 100 Å to about 300 Å.

The first ionic layer 156 may also have a perovskite crystal structure to stabilize the crystallinity of the dielectric layer 110 and the second electrode 150. The perovskite crystal structure may have an $A3B3O_3$ (O: oxygen) composition.

The first ionic layer 156 may have cationic properties as a whole. For example, the first ionic layer 156 may include a positive ionic layer expressed as $[A3O]^{n+}$ and a neutral layer expressed as $[B3O_2]$; and/or A3 may be a trivalent or higher valency cation, and B3 may be a tetravalent cation. Alternatively, the first ionic layer 156 may include a neutral layer expressed as $[A3O]$ and a positive ionic layer expressed as $[B3O_2]_{n+}$; and/or A3 may be a divalent cation, and B3 may be a pentavalent cation.

At least one of the cations included in the first ionic layer 156 may be the same as those included in the semiconductor layer 154 and/or the metallic layer 152. A lattice size of the first ionic layer 156 may be similar to a lattice size of the semiconductor layer 154 and/or the metallic layer 152, and thus, the crystallinity of the second electrode 150 may be increased. In at least one example embodiment, the first ionic layer 156 may include at least one of $LaTiO_3$, $SmTiO_3$, $YTiO_3$, $DyTiO_3$, and $SmTiO_3$. However, the example embodiments are not limited thereto, and it is sufficient as long as an ionic layer is a material having a perovskite structure while having cationic properties as a whole.

The first ionic layer 156 may be a single layer. For example, the first ionic layer 156 may be a single layer in which one positive ionic layer and one neutral layer are three-dimensionally coupled. However, the present disclosure is not limited thereto. The first ionic layer 156 may include a plurality of layers. Even when the first ionic layer 156 includes a plurality of layers, the thickness of the first ionic layer 156 may be less than the thickness of the metallic layer 152 and the thickness of the semiconductor layer 154. For example, the thickness of the first ionic layer 156 may be about 10 Å or less.

Figure 2:
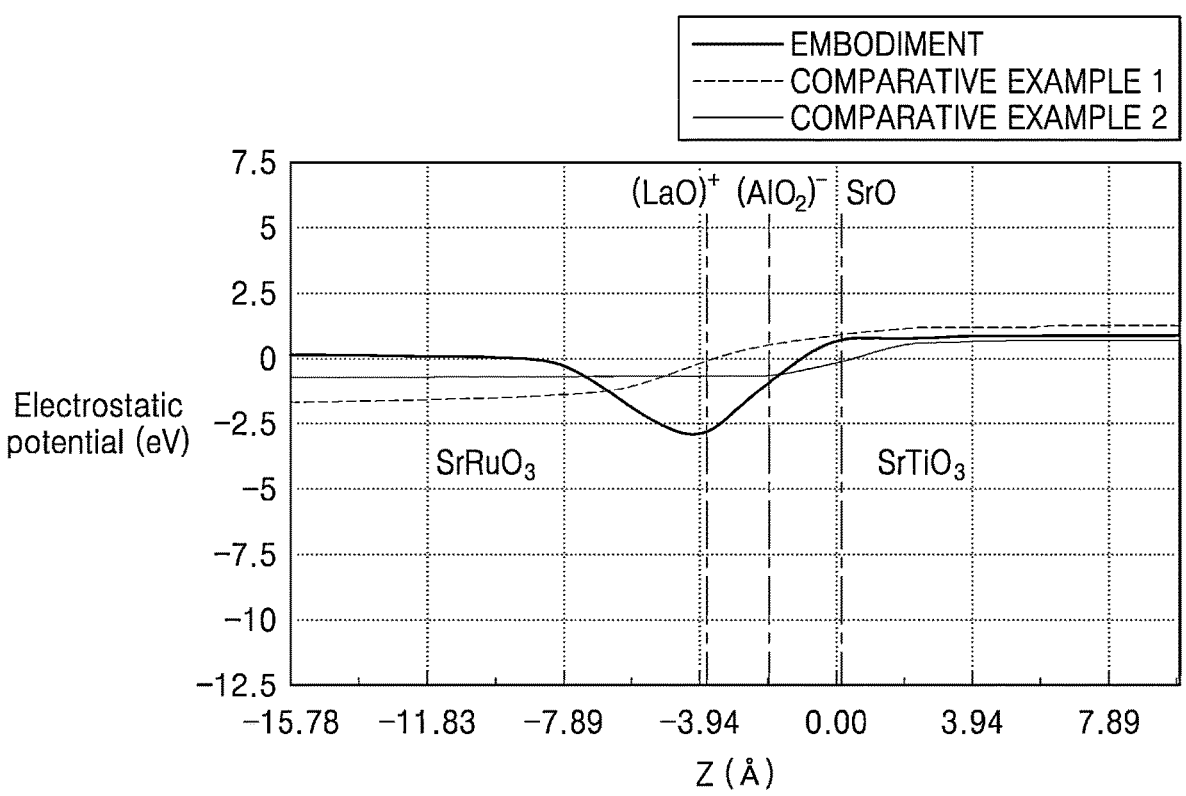
FIG. 2 is a graph showing an electrostatic potential between a base material of a semiconductor layer and a metallic layer, according to at least one example embodiment.

FIG. 2 is a graph showing an electrostatic potential between a base material of a semiconductor layer and a metallic layer according to at least one example embodiment. $SrTiO_3$ was formed as the base material as the semiconductor layer, and $SrTiO_3$ was formed as the metallic layer. The electrostatic potential for the example embodiment in which an positive ionic layer including $[LaO]^+$ is arranged between the base material of the semiconductor layer and the metallic layer, the electrostatic potential for Comparative Example 1 in which an anionic layer including $[AlO_2]^-$ is arranged between the base material of the semiconductor layer and the metallic layer, and the electrostatic potential for Comparative Example 2 in which a neutral layer without ionic properties is arranged between the base material of the semiconductor layer and the metallic layer were measured.

As a result, as shown in FIG. 2, it was confirmed that a potential difference between the base material of the semiconductor layer and the metallic layer was the smallest when an ionic layer having cationic properties is arranged between the base material of the semiconductor layer and the metallic layer. When the base material of the semiconductor layer is doped with a metal element and/or material, the potential difference is expected to be further reduced. As an ionic layer having cationic properties is arranged between a semiconductor layer and a metallic layer, a Schottky barrier between the semiconductor layer and the metallic layer may be reduced.

Figure 3:
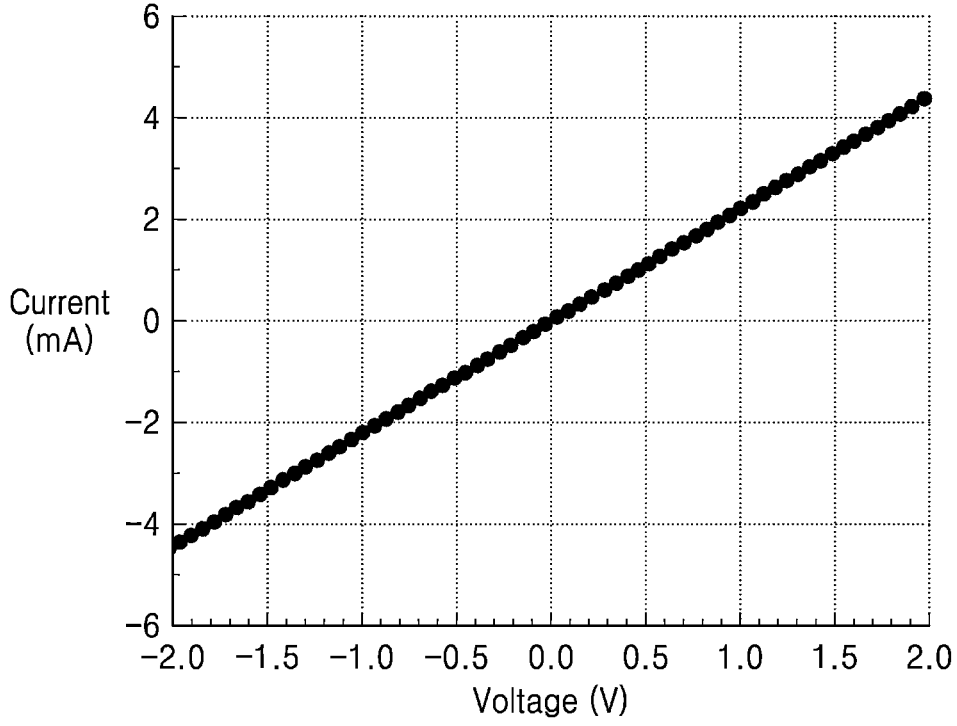
FIG. 3 is a graph showing IV characteristics of a structure of a semiconductor layer/first ionic layer/metallic layer according to at least one example embodiment.

FIG. 3 is a graph showing current-voltage (I-V) characteristics of a structure of a semiconductor layer/first ionic layer/metallic layer according to at least one example embodiment. A semiconductor layer of La-doped $SrTiO_3$, a first ionic layer of $LaTiO_3$, and a metallic layer of $BaRuO_3$ were formed on a substrate, and the IV characteristics were measured. As shown in FIG. 3, it may be confirmed that a measured current is linearly proportional to an applied voltage. This means that the structure of a semiconductor layer/first ionic layer/metallic layer has metallic (and/or electrode) characteristics.

Figure 4:
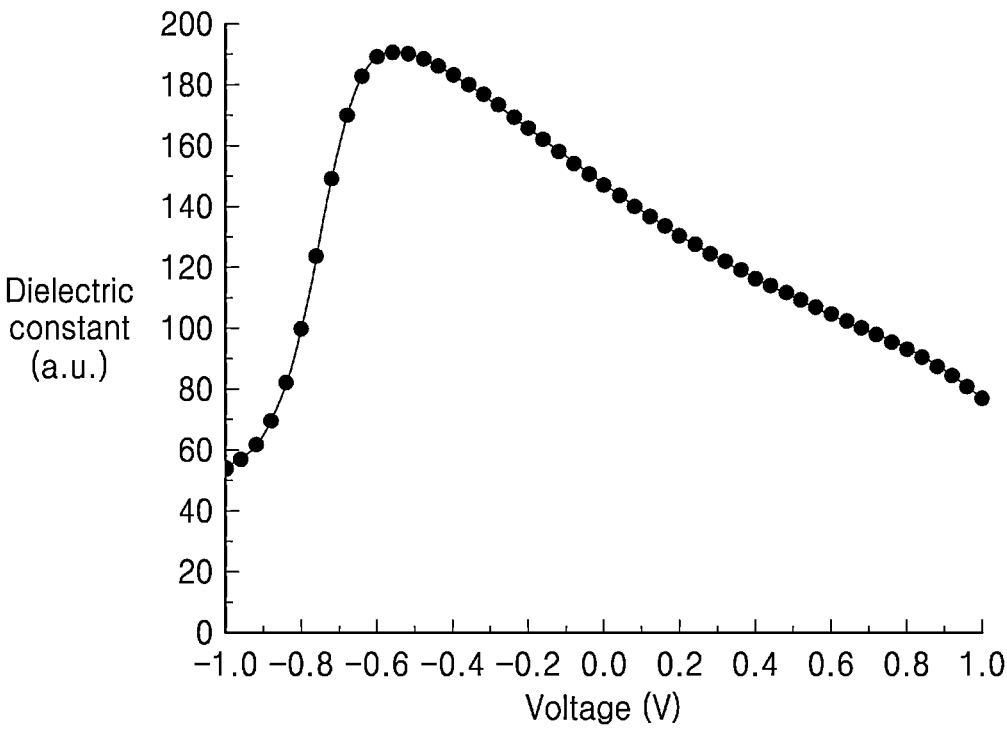
FIG. 4 shows a result obtained by measuring a dielectric constant of a capacitor according to at least one example embodiment.

FIG. 4 shows a result obtained by measuring a dielectric constant of a capacitor according to at least one embodiment. First and second electrodes in which a semiconductor layer of La-doped $SrTiO_3$, a first ionic layer of $LaTiO_3$, and a metallic layer of $BaRuO_3$ are formed, and a dielectric layer of $SrTiO_3$ between the first and second electrodes were formed. Referring to FIG. 4, it may be confirmed that a dielectric constant of a capacitor rises to about 190. This means that the dielectric layer may be expected to have a high dielectric constant.

Figure 5:
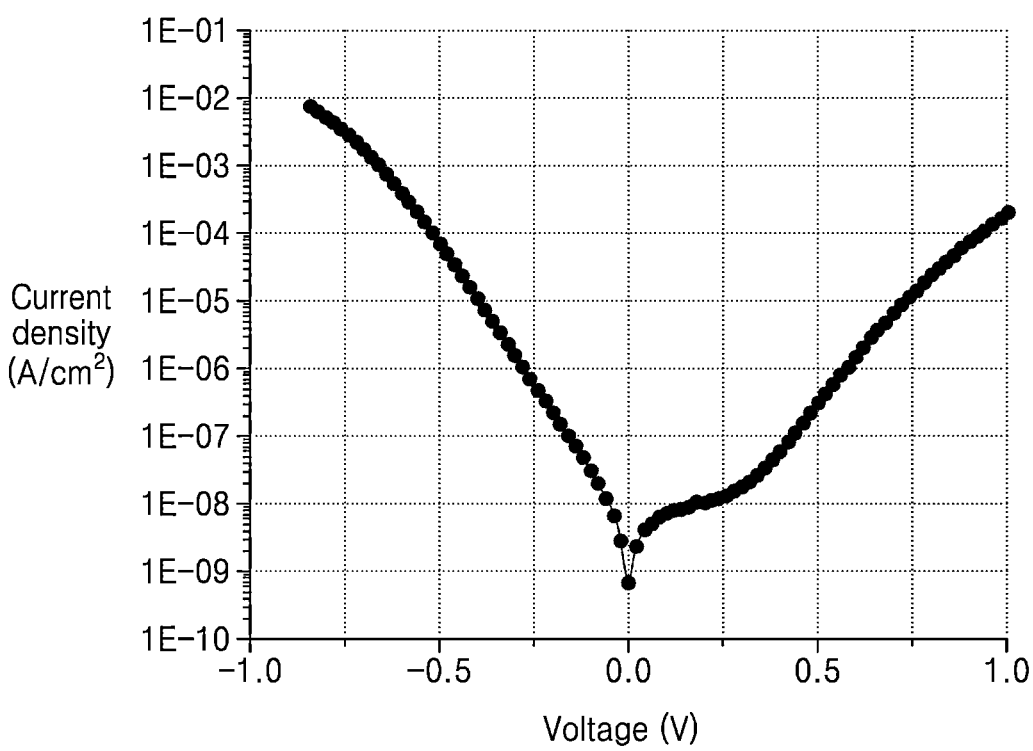
FIG. 5 shows a result obtained by measuring IV characteristics of a capacitor according to at least one example embodiment.

FIG. 5 shows a result obtained by measuring I-V characteristics of a capacitor according to at least one example embodiment. First and second electrodes in which a semiconductor layer of La-doped $SrTiO_3$, a first ionic layer of $LaTiO_3$, and a metallic layer of $BaRuO_3$ are formed, and a dielectric layer of $SrTiO_3$ between the first and second electrodes were formed. As shown in FIG. 5, it may be confirmed that the I-V characteristics of the capacitor according to an embodiment has typical capacitor characteristics. Also, it may be confirmed that almost no leakage current occurs.

Figure 6:
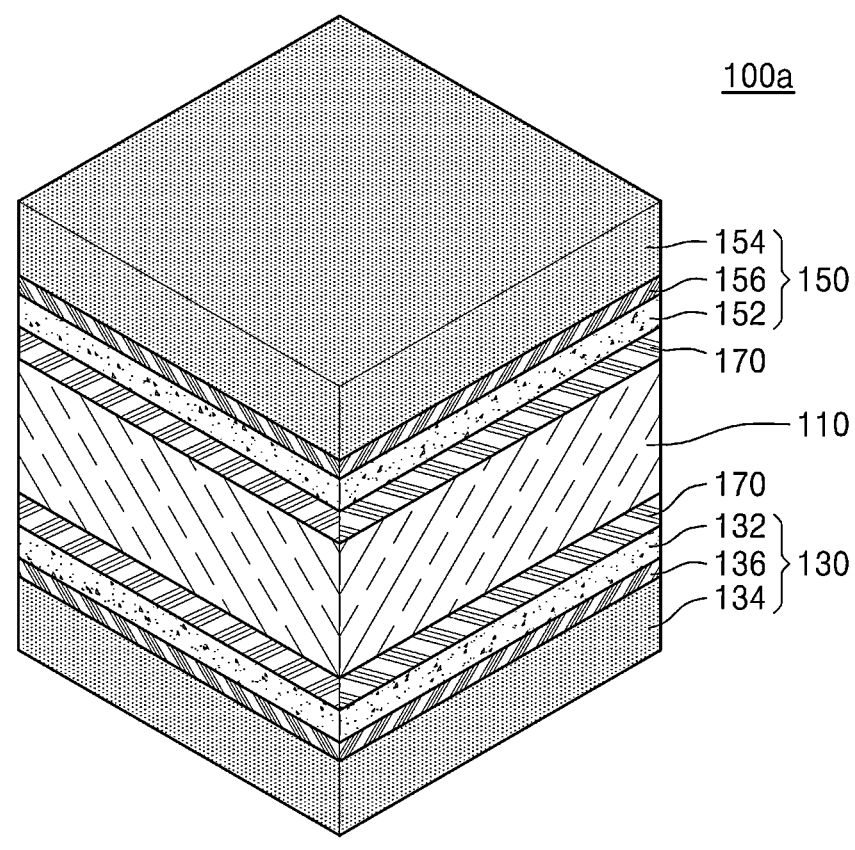
FIG. 6 is a diagram of a capacitor including a second ionic layer according to at least one example embodiment.

FIG. 6 is a diagram of a capacitor 100a including a second ionic layer 170 according to at least one example embodiment. Referring to FIGS. 1 to 6, the configuration of the capacitor 100a of FIG. 6 may be similar to those of the capacitor 100 of FIG. 1 except for the inclusion of the second ionic layer 170. Therefore, redundant descriptions will be omitted. In the capacitor 100a of FIG. 6, the second ionic layer 170 may be further arranged on at least one of between the first electrode 130 and the dielectric layer 110 and between the second electrode 150 and the dielectric layer 110.

The second ionic layer 170 may have the same crystal structure as that of the dielectric layer 110 and may have anionic properties. For example, the second ionic layer 170 may have a perovskite crystal structure, and the perovskite crystal structure may have an $A4B4O_3$ composition. For example, the second ionic layer 170 may include a negative ionic layer expressed as $[A4O]^{n-}$ and a neutral layer expressed as $[B4O_2]$; and/or A4 may be a monovalent cation, and B4 may be a tetravalent cation. Alternatively, the second ionic layer 170 may include a neutral layer expressed as $[A4O]$ and a negative ionic layer expressed as $[B_4O_2]^{n-}$; and/or A4 may be a divalent cation, and B4 may be a monovalent to trivalent cation.

The second ionic layer 170 may include, for example, at least one of $LiTiO_3$, $NaTiO_3$, $KTiO_3$, $RbTiO_3$, $LiZrO_3$, $NaZrO_3$, $KZrO_3$, $RbZrO_3$, $LiHfO_3$, $NaHfO_3$, $KHfO_3$, and/or $RbHfO_3$, but is not limited thereto. For example, in some example embodiments, it is sufficient as long as an ionic layer is a material having a perovskite structure while having anionic properties as a whole.

In at least one example embodiment, the second ionic layer 170 may be a single layer. for example, the second ionic layer 170 may be a single layer in which one negative ionic layer and one neutral layer are three-dimensionally combined.

As the second ionic layer 170 is inserted between the dielectric layer 110 and the metallic layer 132, an interface dipole may be generated between the dielectric layer 110 and the metallic layer 132 to induce a screening charge. For example, as the second ionic layer 170 has anionic properties, a positive screening charge is induced, and thus, a Schottky barrier between the dielectric layer 110 and the metallic layer 132 may be increased. Due to the increase of the Schottky barrier, diffusion of an electric charge of the metallic layer 132 into the dielectric layer 110 may be prevented to suppress a leakage current between electrodes and the dielectric layer 110.

Figure 7:
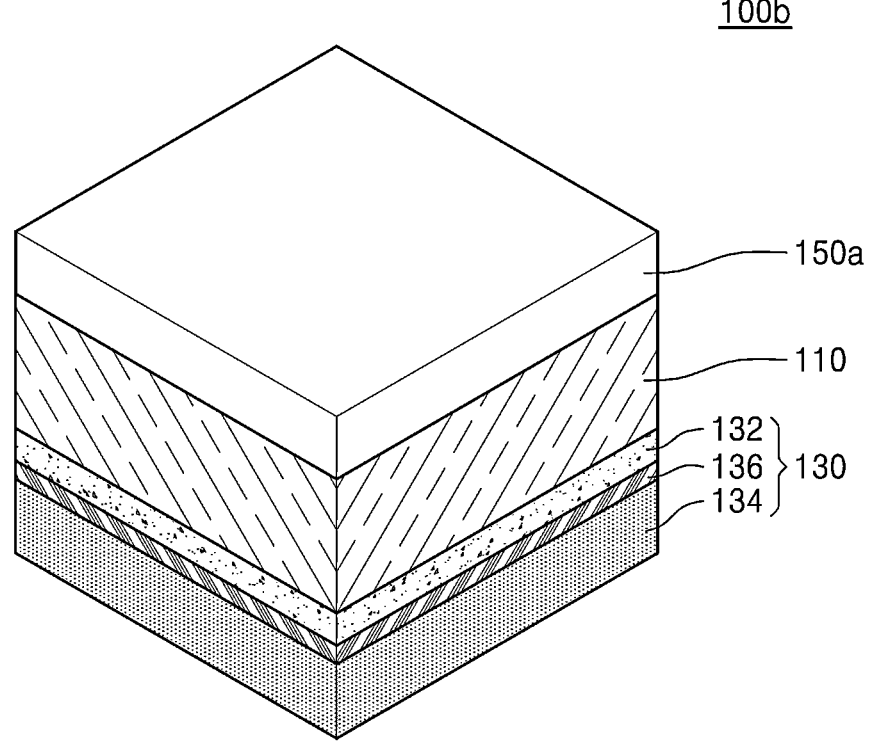
FIG. 7 is a diagram of a capacitor according to at least one example embodiment.

FIG. 7 is a diagram of a capacitor 100b according to at least one example embodiment. Referring to FIGS. 1 to 7, the configuration of the capacitor 100b of FIG. 7 may be similar to those of the capacitor 100 of FIG. 1 except for the substitution of the second electrode 150 with the second electrode 150a. Therefore, redundant descriptions will be omitted. In the capacitor 100b, the dielectric layer 110 and the first electrode 130 of FIG. 7 may be substantially the same as the dielectric layer 110 and the first electrode 130 described with reference to FIG. 1, and the second electrode 150a of FIG. 7 may not have a perovskite crystal structure.

The dielectric layer 110 may be formed on the first electrode 130, which may be referred to as a lower electrode. For example, in at least one example embodiment, the dielectric layer 110 may be epitaxially grown on the first electrode 130. Thus, the crystallinity of the dielectric layer 110 is greatly affected by the crystallinity of the first electrode 130 as the lower electrode. The first electrode 130 is formed in a perovskite crystal structure which is same as a perovskite crystal structure of the dielectric layer 110, but the second electrode 150a, which is an upper electrode that relatively affects the crystallinity of the dielectric layer 110, may not have a perovskite crystal structure.

The second electrode 150a may include at least one of metal, a conductive metal oxide, a doped metal oxide, a conductive metal nitride, a metal carbide, and/or the like, at least one of which does not have a perovskite crystal structure.

The second electrode 150a may include a metal. The second electrode 150a may include, for example, at least one of Ti, W, Ta, Co, Mo, Ni, V, Hf, Al, Cu, Pt, Pd, Ir, Au, and/or Ru. The metal of the second electrode 150a is not limited thereto, and any metal used for an electrode in the art may be used for the second electrode 150a.

The second electrode 150a may include a conductive metal oxide. For example, the second electrode 150a may include at least one of $RuO_2$, $IrO_2$, $PtO_2$, $SnO_2$, $MnO_2$, $Sb_2O_3$, and/or $In_2O_3$. The metal oxide of the second electrode 150a is not limited thereto, and any oxide of a metal used for an electrode in the art may be used for the second electrode 150a.

The second electrode 150a may include a doped metal oxide. For example, the second electrode 150a may include, for example, at least one of Ta-doped $SnO_2$, Ti-doped $In_2O_3$, Ni-doped $SnO_2$, Sb-doped $SnO_2$, and/or Al-doped ZnO. The doped metal oxide of the second electrode 150a is not limited thereto, and any oxide of a doped metal used for an electrode in the art may be used for the second electrode 150a. A type of dopant, is not particularly limited, and any dopant that improves the conductivity of a metal oxide may be used for the second electrode 150a.

The second electrode 150a may include a metal nitride. For example, the second electrode 150a may include at least one of TiN, WN, TaN, TiAlN, TaSiN, TiSiN, WSiN, TiAlN, TiCN, TiAlCN, RuCN, and RuTiN. The metal nitride of the second electrode 150a is not limited thereto, and any nitride of a metal used for an electrode in the art may be used. The metal nitride may include a carbon-containing nitride of a metal.

Figure 8:
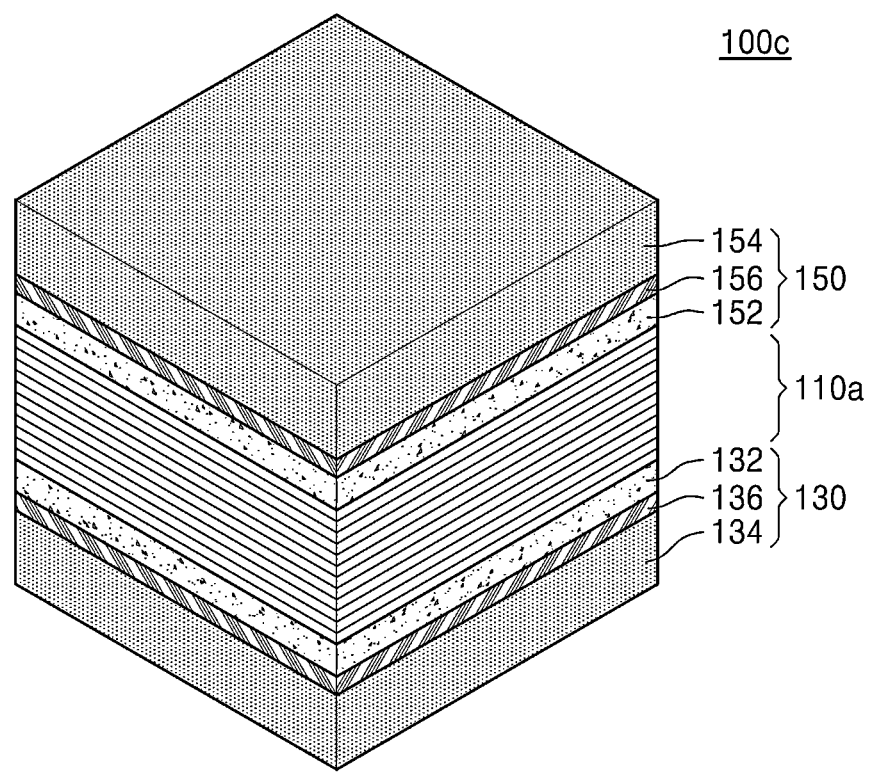
FIG. 8 is a diagram of a capacitor according to at least one example embodiment.

FIG. 8 is a diagram of a capacitor 100c according to at least one example embodiment. Referring to FIGS. 1 to 8, the configuration of the capacitor 100c of FIG. 8 may be similar to those of the capacitor 100 of FIG. 1 except for the substitution of the dielectric layer 110 with the dielectric layer 110a. Therefore, redundant descriptions will be omitted. In the capacitor 100c, the dielectric layer 110a may have a superlattice structure including first unit layers and second unit layers, which are alternately stacked. The first unit layers and the second unit layers may have different dielectric characteristics and may each have an atomic thickness. For example, the first unit layers may each include an [$AlO_3$] layer and a [$BlO_3$] layer coupled to each other such that the first unit cell includes a first property, and the second unit layers may each include an [$AlO_3$] and a [$BlO_3$] layer of a second type, such that the second unit layers include a second property different from the first property. For example, the first unit layers may include a ferroelectric material having a perovskite crystal structure and/or the second unit layers may include a paraelectric material having a perovskite crystal structure.

Figure 9:
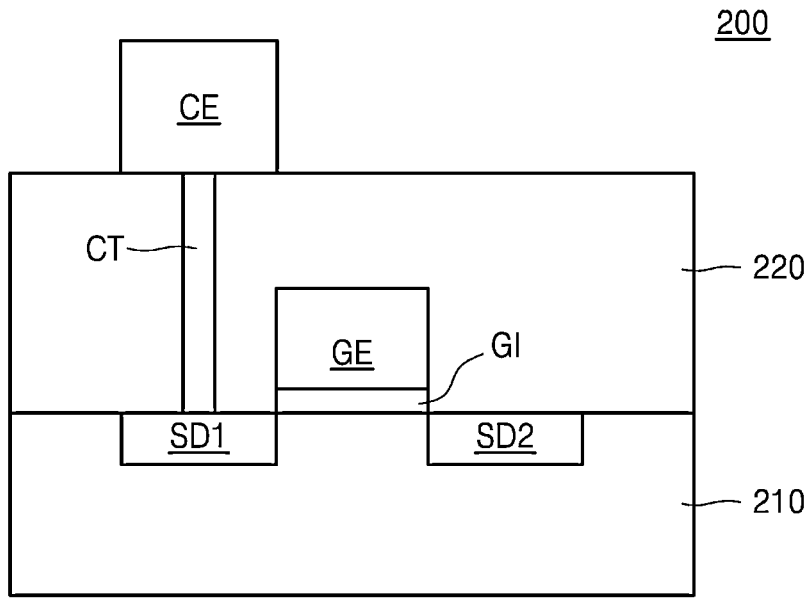
FIG. 9 is a cross-sectional view of a semiconductor device according to at least one example embodiment.

FIG. 9 is a cross-sectional view of a semiconductor device according to at least one example embodiment. For brevity of description, contents substantially the same as those already given with reference to FIGS. 1, and 6 to 8 may be omitted.

Referring to FIG. 9, provided is a semiconductor device 200 including a substrate 210, a gate electrode GE, a gate insulating film GI, an interlayer insulating film 220, a contact CT, and a capacitor CE. The substrate 210 may include be and/or an elemental and/or a compound semiconductor. For example, the substrate 210 may be (and/or include) a silicon substrate, a germanium substrate, a silicon-germanium substrate, and/or the like.

A first source/drain area SD1 and a second source/drain area SD2 may be provided on the substrate 210. The first and second source/drain areas SD1 and SD2 may be spaced apart from each other in a direction parallel to an upper surface of the substrate 210. In at least one example embodiment, the first and second source/drain areas SD1 and SD2 may be formed by injecting impurities into the substrate 210.

The gate electrode GE may be provided on the substrate 210. The gate electrode GE may be provided between the first and second source/drain areas SD1 and SD2. An area of the substrate 210 under the gate electrode GE and between the first and second source/drain areas SD1 and SD2 may be referred to a channel area. The gate electrode GE may include a conductive material. For example, the gate electrode GE may include a metal and/or polysilicon.

The gate insulating film GI may be provided between the gate electrode GE and the substrate 210. The gate insulating film GI may be arranged between the gate electrode GE and the substrate 210. The gate insulating film GI may include an insulating material. For example, the gate insulating film GI may include an oxide of Si (e.g., $SiO_2$), an oxide of Al (e.g., $Al_2O_3$), a high-k material (e.g., $HfO_2$), and/or the like. The gate insulating film GI and the gate electrode GE may be referred to as a gate structure, and the channel area, first and second source/drain areas SD1 and SD2, and the gate structure may be referred to as a transistor.

The interlayer insulating film 220 may be provided on the substrate 210. The interlayer insulating film 220 may cover the gate electrode GE and the gate insulating film GI. The interlayer insulating film 220 may include an insulating material. For example, the interlayer insulating film 220 may include an oxide of Si (e.g., $SiO_2$), an oxide of Al (e.g., $Al_2O_3$), a high-k material (e.g., $HfO_2$), and/or the like.

The capacitor CE may be provided on the interlayer insulating film 220. The capacitor CE may include one of capacitors 100, 100a, 100b, and/or 100c respectively described with reference to FIGS. 1, and 6 to 8. However, the shape of the capacitor CE is not limited to those shown in FIGS. 1, and 6 to 8. The shape of the capacitor CE may be selected as needed within a range including the technical ideas disclosed in FIGS. 1, and 6 to 8. The capacitor CE may be connected to one of the source/drain areas (e.g., one of the first or second drain areas SD1 or SD2) through the contact CT. The contact may be and/or include a conductive material and may penetrate through the interlayer insulating film 220. However, the example embodiments are not limited thereto, and in some example embodiments, the capacitor CE may be directly contact the source/drain area.

The capacitor CE may include an electrode having a perovskite crystal structure and high crystallinity. Accordingly, a dielectric layer of the capacitor CE may have a perovskite crystal structure but high crystallinity and high dielectric constant. The capacitor CE may have improved capacitance characteristics. As a result, the present disclosure may provide the semiconductor device 200 including the capacitor CE having improved capacitance characteristics.

Figure 10:
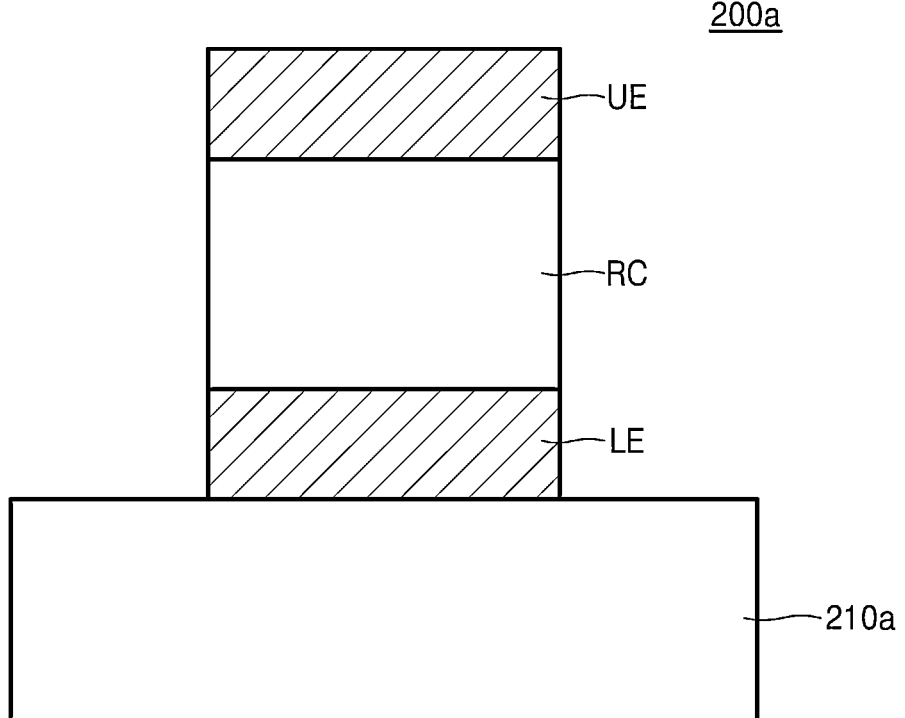
FIG. 10 is a cross-sectional view of a memory element according to at least one example embodiment.

FIG. 10 is a cross-sectional view of a memory element 200a according to an example embodiment. For brevity of description, contents substantially the same as those already given with reference to FIGS. 1, and 6 to 9 may be omitted.

Referring the FIG. 10, the memory element 200a may be provided. The memory element 200a may be an element that stores information in a resistive random access memory (RRAM). The memory element 200a may include the substrate 210, a lower electrode LE, a resistance changing layer RC, and an upper electrode UE. The lower electrode LE, the resistance changing layer RC, and the upper electrode UE may be memory elements that store information. The substrate 210 may be substantially the same as the substrate 210 described with reference to FIG. 9. In at least one example embodiment, lines, passive elements, and/or active elements may be provided on and/or in the substrate 210. The lower electrode LE may be substantially the same as the first electrode 130 (and/or the second electrodes 150 and 150a) described above. The upper electrode UE may be the same as the second electrodes 150 and 150a (and/or the first electrode 130) described above. In addition, a second ionic layer may also be further arranged on at least one of between the lower electrode LE and the resistance changing layer RC and between the upper electrode UE and the resistance changing layer RC.

The resistance changing layer RC may be provided on the lower electrode LE. The resistance changing layer RC may include a resistance changing material. The resistance changing material may refer to a material in which a resistance thereof changes according to an applied voltage. For example, the resistance changing layer RC may be an insulating film having a perovskite crystal structure. For example, the resistance changing layer RC may include $PbZrTiO_3$, $PrCaMnO_3$, calcium-doped $(Ba, Sr)TiO_3$, and/or the like.

The resistance changing characteristics of the resistance changing layer RC having a perovskite crystal structure may vary according to the crystallinity of the resistance changing layer RC. For example, when the crystallinity of the resistance changing layer RC is low, the resistance changing characteristics may be deteriorated, and when the crystallinity of the resistance changing layer RC is high, the resistance changing characteristics may be maintained. The crystallinity of the resistance changing layer RC may be affected by the crystallinity of the lower electrode LE and the upper electrode UE each having a perovskite crystal structure. Accordingly, to stably maintain the resistance changing characteristics of the resistance changing layer RC, it may be required that the lower electrode LE and the upper electrode UE have high crystallinity.

In some example embodiments, the lower electrode LE of the present disclosure may have the same structure as that of the first electrode 130. For example, the lower electrode LE may include the metallic layer 132 having a perovskite crystal structure, the semiconductor layer 134 that controls an increase in metallic resistivity, and the first ionic layer 136 that forms an ohmic contact between the metallic layer 132 and the semiconductor layer 134.

In some example embodiments, the upper electrode UE may be substantially the same as the second electrode 150. For example, the upper electrode UE may include the metallic layer 132 having a perovskite crystal structure, the semiconductor layer 134 that controls an increase in metallic resistivity, and the first ionic layer 136 that forms an ohmic contact between the metallic layer 132 and the semiconductor layer 134. However, the present disclosure is not limited thereto. For example, the upper electrode UE may also include a metal and/or a metal alloy that does not have a perovskite crystal structure.

Figure 11:
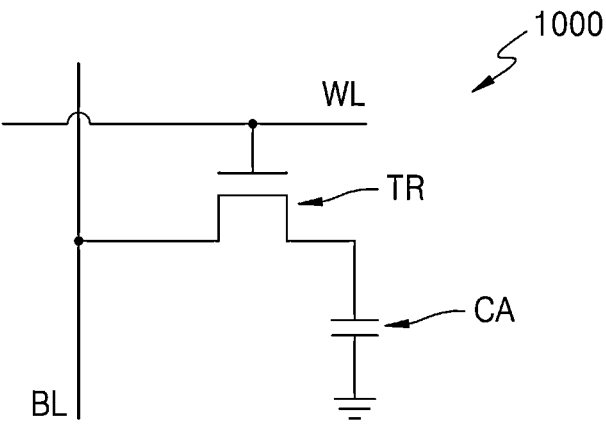
FIG. 11 is a circuit diagram describing a schematic circuit configuration and operation of an electronic device employing a capacitor, according to some example embodiments.

FIG. 11 is a circuit diagram describing a schematic circuit configuration and operation of an electronic device 1000 employing a capacitor, according to some example embodiments.

The circuit diagram of the electronic device 1000 is for one cell of a DRAM, and the electronic device 1000 includes one transistor TR, one capacitor CA, a word line WL, and a bit line BL. The capacitor CA may be at least one of the capacitors 100, 100a, 100b, and/or 100c as described above.

A method of writing data to the DRAM is as follows. After a gate voltage (high) for turning the transistor TR on ("ON" state) is applied to a gate electrode through the word line WL, VDD (high) or 0 (low), which is a data voltage value to be input, is applied to the bit line BL. When a high voltage is applied to the word line and the bit line, the capacitor CA is charged (e.g., data "1" is written). When a high voltage is applied to the word line and a low voltage is applied to the bit line, the capacitor CA is discharged (e.g., data "0" is written).

A method of reading data from the DRAM is as follows. After a high voltage is applied to the word line WL to turn on the transistor TR of the DRAM, a voltage of VDD/2 is applied to the bit line BL. When the data of the DRAM is "1" (e.g., when the voltage of the capacitor CA is VDD)) charges stored in the capacitor CA slowly move to the bit line BL and the voltage of the bit line BL becomes slightly higher than VDD/2. In contrast, when the data of capacitor CA is "0", charges of the bit line BL move to the capacitor CA and the voltage of the bit line BL becomes slightly lower than VDD/2. A sense amplifier (not illustrated) may sense and amplify the potential difference of the bit line and determine whether the data is "0" or "1."

Figure 12:
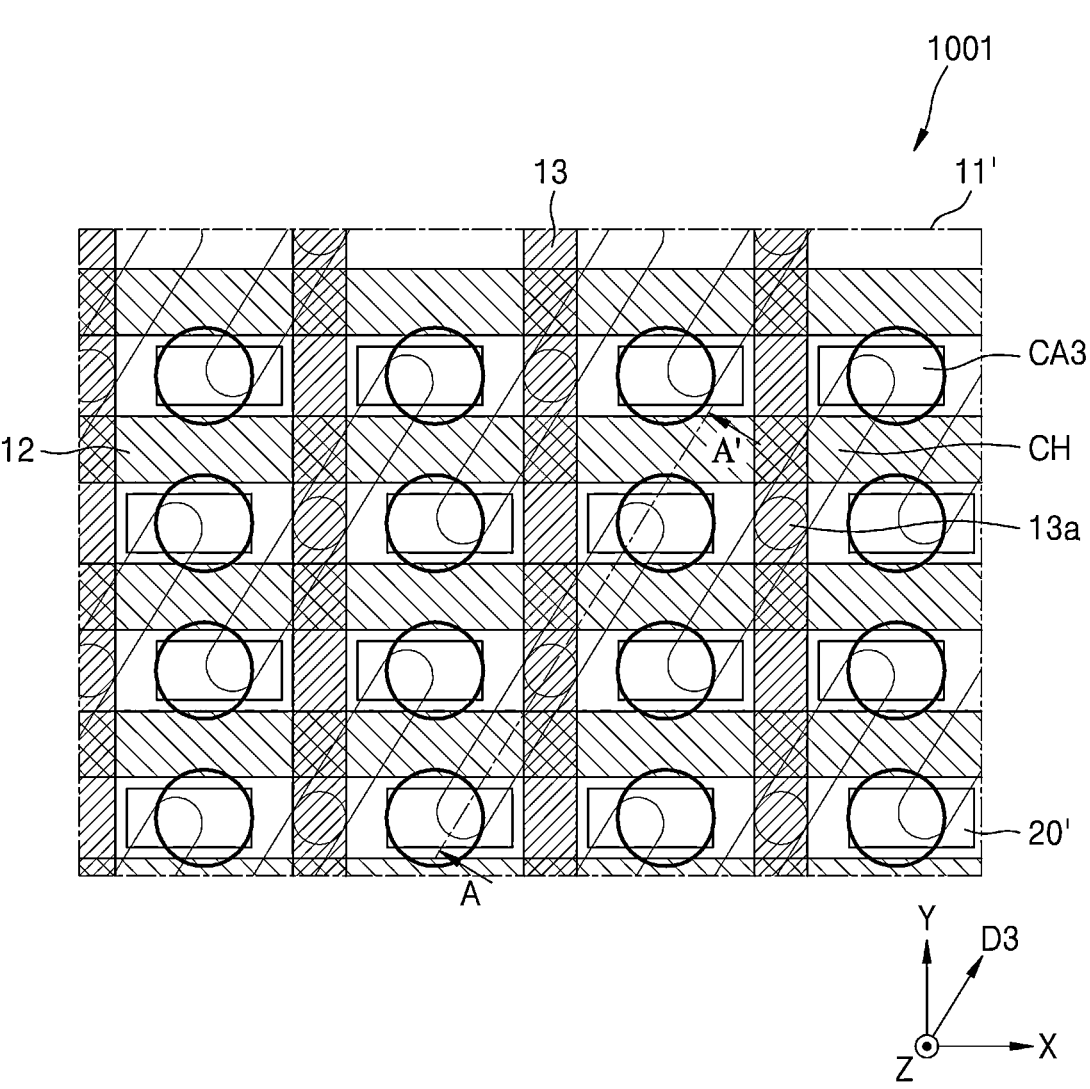
FIG. 12 is a plan view illustrating an electronic device according to some example embodiments.

FIG. 12 is a plan view illustrating an electronic device 1001 according to some example embodiments.

Referring to FIG. 12, the electronic device 1001 may include a structure in which a plurality of capacitors and a plurality of field effect transistors are repeatedly arranged. The electronic device 1001 may include a field effect transistor, a contact structure 20', and a capacitor CA3. The field effect transistor includes a source, a drain, and a channel. The field effect transistor includes a semiconductor substrate 11' and a gate stack 12. The contact structure 20' is arranged on the semiconductor substrate 11' so as not to overlap the gate stack 12. The capacitor CA3 is arranged on the contact structure 20'. The electronic device 1001 may further include a bit line structure 13 electrically connecting the field effect transistors to each other. The capacitor CA3, the gate stack 12 and/or the contact structure 20' may, respectively, be substantially similar to the capacitor CE, the gate structure, and/or the contact CT, as illustrated in FIG. 9.

Although FIG. 12 illustrates that both the contact structure 20' and the capacitor CA3 are repeatedly arranged in the X and Y directions, the present disclosure is not limited thereto. For example, the contact structure 20' may be arranged in the X and Y directions, and the capacitor CA3 may be arranged in a hexagonal shape such as a honeycomb structure.

Figure 13:
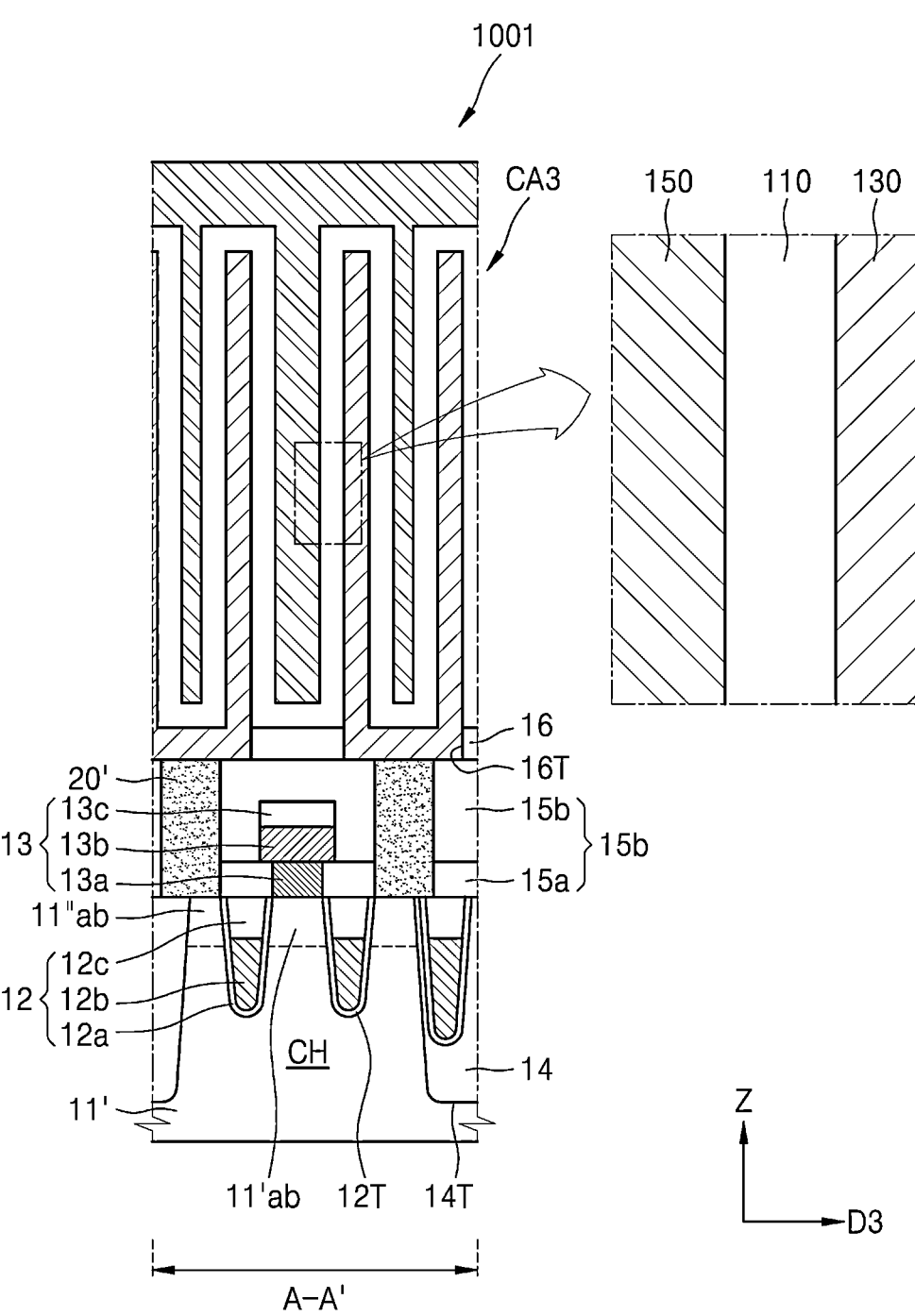
FIG. 13 is a cross-sectional view of the electronic device taken along line A-A' of FIG. 11.

FIG. 13 is a cross-sectional view of the electronic device 1001 taken along line A-A' of FIG. 12.

Referring to FIG. 13, the semiconductor substrate 11' may have a shallow trench isolation (STI) structure including a device isolation layer 14. The device isolation layer 14 may be a single layer including one type of insulating layer, or multiple layers including a combination of two or more types of insulating layers. The device isolation layer 14 may include a device isolation trench 14T in the semiconductor substrate 11', and the device isolation trench 14T may be filled with an insulating material. The insulating material may include at least one of fluoride silicate glass (FSG), undoped silicate glass (USG), boro-phospho-silicate glass (BPSG), phospho-silicate glass (PSG), flowable oxide (FOX), plasma enhanced tetra-ethyl-ortho-silicate (PE-TEOS), tonen silazene (TOSZ), and/or the like, but the present disclosure is not limited thereto.

The semiconductor substrate 11' may further include a channel region CH defined by the device isolation layer 14, and a gate line trench 12T parallel to the upper surface of the semiconductor substrate 11' and extending in the X direction. The channel region CH may have a relatively long island shape having a minor axis and a major axis. The major axis of the channel region CH may be arranged in a D3 direction parallel to the upper surface of the semiconductor substrate 11', as illustrated in FIG. 13.

The gate line trench 12T may be arranged to cross the channel region CH at a certain depth from the upper surface of the semiconductor substrate 11', or may be arranged inside the channel region CH. The gate line trench 12T may also be arranged inside the device isolation trench 14T. The gate line trench 12T inside the device isolation trench 14T may have a lower bottom surface than that of the gate line trench 12T of the channel region CH. A first source/drain 11'ab and a second source/drain 11''ab may be arranged in an upper portion of the channel region CH located at both sides of the gate line trench 12T.

The gate stack 12 may be arranged inside the gate line trench 12T. For example, a gate insulating layer 12a, a gate electrode 12b, and a gate capping layer 12c may be sequentially arranged inside the gate line trench 12T. The gate insulating layer 12a and the gate electrode 12b may be the same as described above, and the gate capping layer 12c may include at least one of silicon oxide, silicon oxynitride, and silicon nitride. The gate capping layer 12c may be arranged on the gate electrode 12b to fill the remaining portion of the gate line trench 12T.

A bit line structure 13 may be arranged on the first source/drain 11'ab. The bit line structure 13 may be arranged parallel to the upper surface of the semiconductor substrate 11' and extend in the Y direction. The bit line structure 13 may be electrically connected to the first source/drain 11'ab, and may include a bit line contact 13a, a bit line 13b, and a bit line capping layer 13c, which are sequentially stacked on the substrate. For example, the bit line contact 13a may include polysilicon, the bit line 13b may include a metal material, and/or the bit line capping layer 13c may include an insulating material such as silicon nitride or silicon oxynitride.

Although FIG. 13 illustrates that the bit line contact 13a has a bottom surface at the same level as the upper surface of the semiconductor substrate 11', this is only an example, and the present disclosure is not limited thereto. For example, in another embodiment, a recess formed to a certain depth from the upper surface of the semiconductor substrate 11' may be further provided. The bit line contact 13a may extend to the inside of the recess so that the bottom surface of the bit line contact 13a is lower than the upper surface of the semiconductor substrate 11'.

The bit line structure 13 may further include a bit line intermediate layer (not illustrated) between the bit line contact 13a and the bit line 13b. The bit line intermediate layer may include metal silicide such as tungsten silicide, or metal nitride such as tungsten nitride. In addition, a bit line spacer (not illustrated) may be further formed on a sidewall of the bit line structure 13. The bit line spacer may have a single-layer structure or a multilayer structure and may include an insulating material such as silicon oxide, silicon oxynitride, or silicon nitride. In addition, the bit line spacer may further include an air space (not illustrated).

The contact structure 20' may be arranged on the second source/drain 11"ab. The contact structure 20' and the bit line structure 13 may be arranged on different sources/drains on the substrate. The contact structure 20' may have a structure in which a lower contact pattern (not illustrated), a metal silicide layer (not illustrated), and an upper contact pattern (not illustrated) are sequentially stacked on the second source/drain 11"ab. The contact structure 20' may further include a barrier layer (not illustrated) surrounding the side surface and the bottom surface of the upper contact pattern. For example, the lower contact pattern may include polysilicon, the upper contact pattern may include a metal material, and the barrier layer may include a conductive metal nitride.

A capacitor CA3 may be arranged on the semiconductor substrate 11' and electrically connected to the contact structure 20'. For example, the capacitor CA3 may include a lower electrode 130 electrically connected to the contact structure 20', an upper electrode 150 apart from the lower electrode 130, and a dielectric layer 110 between the lower electrode 130 and the upper electrode 150. The lower electrode 130 may have a cylindrical shape or a cup shape having an internal space with a closed bottom. The upper electrode 150 may have a comb shape having comb teeth extending into an internal space formed by the lower electrode 130 and a region between the adjacent lower electrodes 130. The dielectric layer 110 may be arranged between the lower electrode 130 and the upper electrode 150 so as to be parallel to the surfaces of the lower electrode 130 and the upper electrode 150.

Because materials of the lower electrode 130, the dielectric layer 110, and the upper electrode 150 constituting the capacitor CA3 are substantially the same as those of the capacitors 100, 100a, 100b, and/or 100c as described above, therefore detailed descriptions thereof are omitted.

An interlayer insulating layer 15 may be further arranged between the capacitor CA3 and the semiconductor substrate 11'. The interlayer insulating layer 15 may be substantially similar to the interlayer insulating film 220 described above, and therefore detailed description thereof is omitted.

In addition, when a plurality of capacitors CA3 are arranged, bottom surfaces of a plurality of lower electrodes 130 may be separated from each other by an etch stop layer 16. For example, the etch stop layer 16 may include an opening 16T, and the bottom surface of the lower electrode 130 of the capacitor CA3 may be arranged in the opening 16T. As illustrated, the lower electrode 130 may have a cup shape having an internal space with a closed bottom. The capacitor CA3 may further include a support (not illustrated) that prevents the lower electrode 130 from being tilted or collapsed. The support may be arranged on the sidewall of the lower electrode 130.

Figure 14:
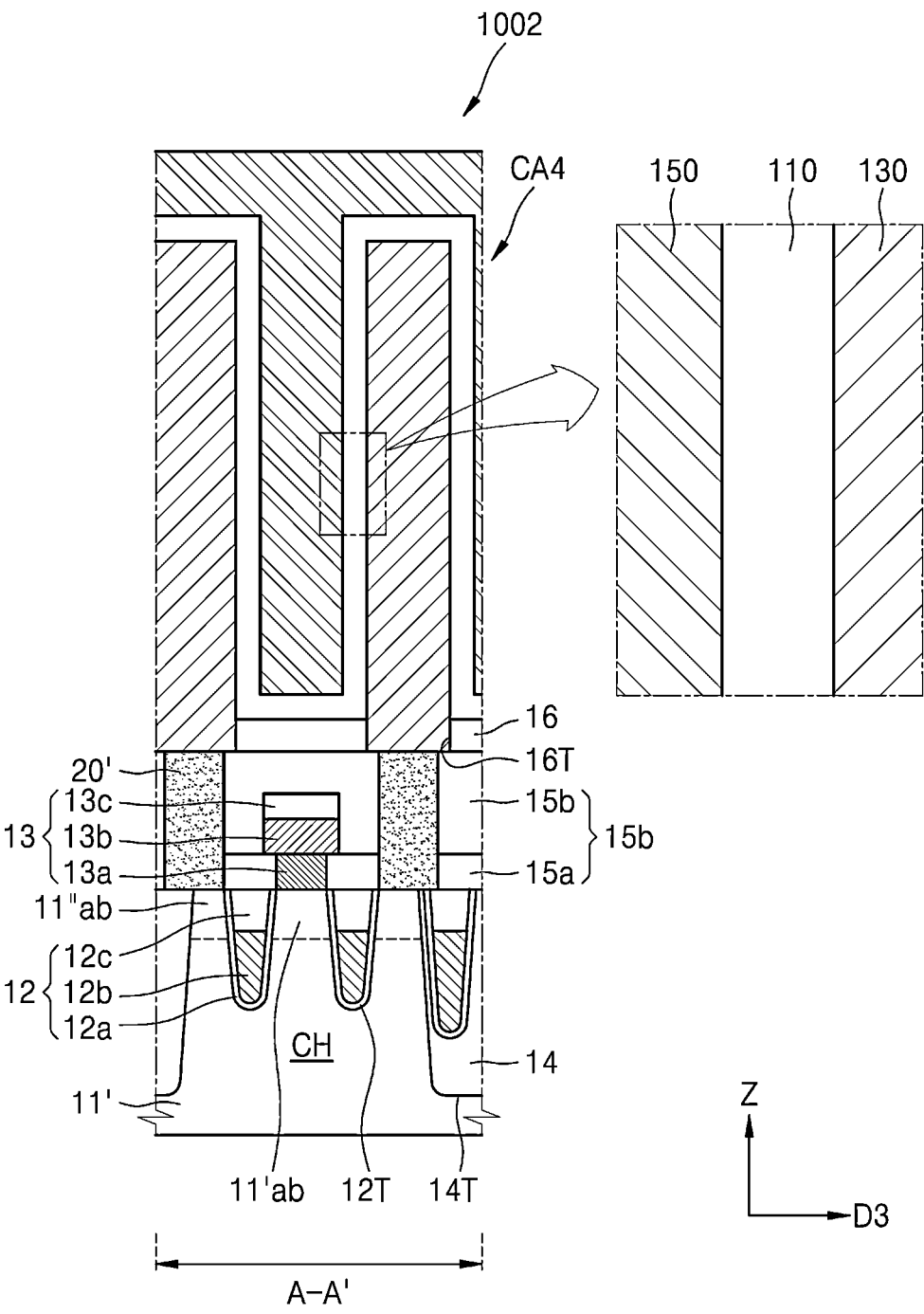
FIG. 14 is a cross-sectional view illustrating an electronic device according to some example embodiments.

FIG. 14 is a cross-sectional view illustrating an electronic device 1002 according to another example embodiment.

The cross-sectional view of the electronic device 1002 according to the present example embodiments correspond to the cross-sectional view taken along line A-A' of FIG. 12, and the electronic device of FIG. 14 differs from the electronic device 1001 of FIG. 13 only in a shape of a capacitor CA4. The capacitor CA4 is arranged on a semiconductor substrate 11' and electrically connected to a contact structure 20'. The capacitor CA4 includes a lower electrode 130 electrically connected to the contact structure 20', an upper electrode 150 spaced apart from the lower electrode 130, and a dielectric layer 110 between the lower electrode 130 and the upper electrode 150. Materials of the lower electrode 130, the dielectric thin-film 110, and the upper electrode 150 are substantially the same as those of the capacitors 100, 100a, 100b, and/or 100c as described above, therefore detailed descriptions thereof are omitted.

The lower electrode 130 may have a pillar shape, a square pillar and/or a polygonal pillar, which extends in the vertical direction (Z direction). The upper electrode 150 may have a comb shape having comb teeth extending into a region between the adjacent lower electrodes 130. The dielectric layer 110 may be arranged between the lower electrode 130 and the upper electrode 150.

The capacitors and the electronic devices, according to the above-described example embodiments may be applied to various application fields. For example, the electronic devices according to the embodiments may be applied as logic devices or memory devices. The electronic devices according to the embodiments may be used for arithmetic operations, program execution, temporary data retention, and the like in devices such as mobile devices, computers, laptop computers, sensors, network devices, and neuromorphic devices. In addition, the electronic devices according to the embodiments may be useful for devices in which an amount of data transmission is large and data transmission is continuously performed.

Figure 15:
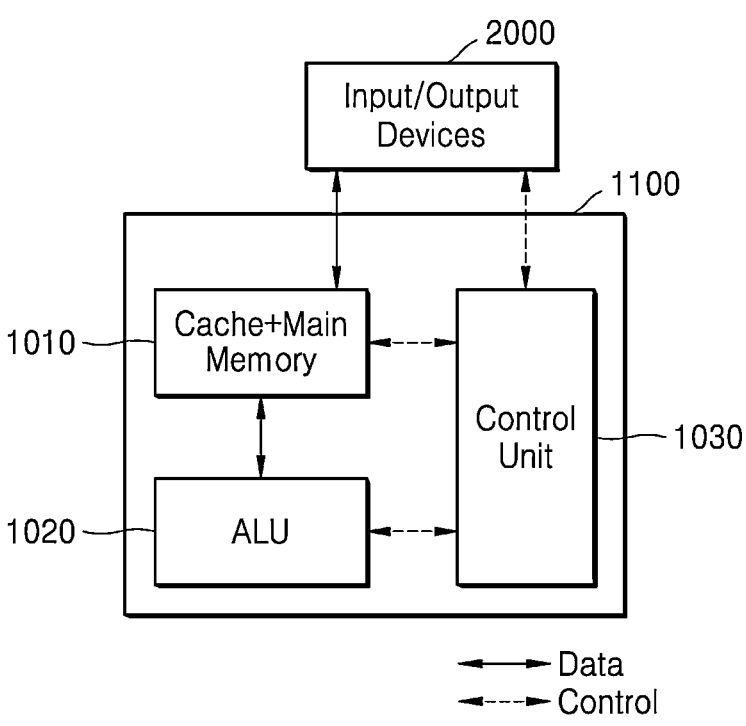
FIGS. 15 and 16 are conceptual diagrams schematically illustrating a device architecture applicable to a device according to some example embodiments.
Figure 16:
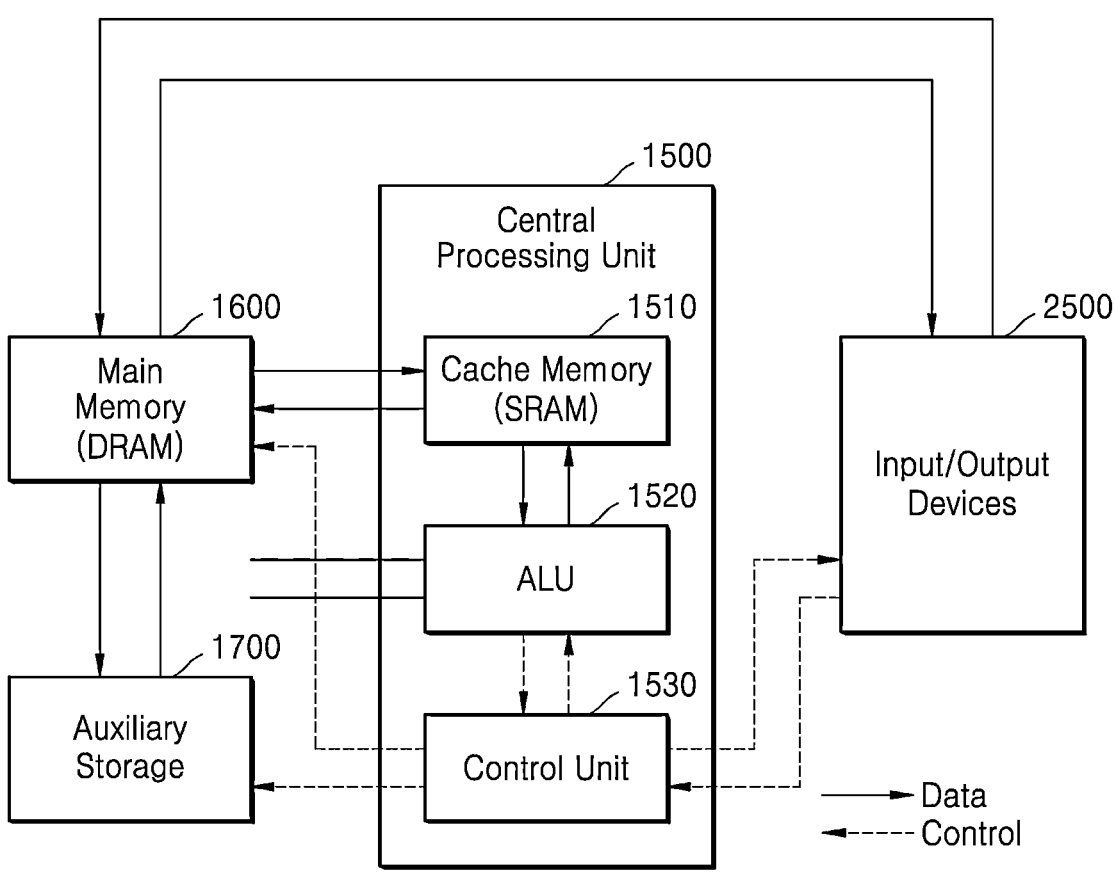

FIGS. 15 and 16 are conceptual diagrams schematically illustrating device architectures applicable to a device according to an example embodiment.

Referring to FIG. 16, an electronic device architecture 1100 may include a memory unit 1010, an arithmetic logic unit (ALU) 1020, and a control unit 1030. The memory unit 1010, the ALU 1020, and the control unit 1030 may be electrically connected to each other. For example, the electronic device architecture 1100 may be implemented as a single chip including the memory unit 1010, the ALU 1020, and the control unit 1030.

The memory unit 1010, the ALU 1020, and the control unit 1030 may be interconnected in an on-chip manner via a metal line to perform direct communication. The memory unit 1010, the ALU 1020, and the control unit 1030 may be monolithically integrated on a single substrate to constitute a single chip. Input/output devices 2000 may be connected to the electronic device architecture (chip) 1100. In addition, the memory unit 1010 may include both a main memory and a cache memory. The electronic device architecture (chip) 1100 may be an on-chip memory processing unit. The memory unit 1010 may each include the capacitor and/or the electronic device including the same, which have been described above. The ALU 1020 or the control unit 1030 may also include the capacitor described above.

Referring to FIG. 16, a cache memory 1510, an ALU 1520, and a control unit 1530 may constitute a central processing unit (CPU) 1500, and the cache memory 1510 may include a static random access memory (SRAM). Apart from the CPU 1500, a main memory 1600 and an auxiliary storage 1700 may be provided. The memory unit 1010 and/or the main memory 1600 may be a DRAM, and may include, e.g., the capacitor and/or the electronic device including the same, which have been described above. In some cases, the electronic device architecture may be implemented in a form in which computing unit elements and memory unit elements are adjacent to each other on a single chip, without distinction of sub-units.

The present disclosure may provide the memory element 200a including the resistance changing layer RC having high crystallinity.

The present disclosure may provide an electrode that stably maintains a perovskite crystal structure.

The present disclosure may provide a dielectric layer that stably maintains a perovskite crystal structure.

The present disclosure may provide a dielectric layer having a high dielectric constant.

The present disclosure may provide a capacitor having improved capacitance characteristics.

The present disclosure may provide a semiconductor device including a capacitor having improved capacitance characteristics.

However, the effects of the present disclosure are not limited to the above disclosure.

In the above, the capacitors 100, 100a, 100b, and 100c having a perovskite crystal structure and devices 200 and 200a including the capacitor 100 have been illustrated and described, but the present embodiments are not limited to the specific example embodiments described above, and various modifications may be made by one of ordinary in the art without departing from the gist of the present invention as claimed in the claims, and these modifications should not be understood separately from the technical concept or perspective of the present disclosure.

It should be understood that the example embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A capacitor comprising:
a first electrode;
a second electrode spaced apart from the first electrode; and
a dielectric layer having a perovskite crystal structure, the dielectric layer between the first electrode and the second electrode,
wherein at least one of the first electrode and the second electrode comprises
a metallic layer having a perovskite crystal structure,
a first ionic layer, the first ionic layer having an unbalanced charge such that the first ionic layer, as a whole, has ionic properties, and
a semiconductor layer having a perovskite crystal structure, and
wherein the metallic layer, the first ionic layer, and the semiconductor layer are sequentially arranged in a direction away from the dielectric layer.

2. The capacitor of claim 1, wherein the metallic layer has an A1B1O3 (O: oxygen) composition, and B1 is a metal.

3. The capacitor of claim 1, wherein the metallic layer comprises at least one of $BaRuO_3$, $BaMoO_3$, $BaIrO_3$, $BaVO_3$, $SrRuO_3$, $SrMoO_3$, $SrIrO_3$, or $SrVO_3$.

4. The capacitor of claim 1, wherein a thickness of the metallic layer is 50 Å or less.

5. The capacitor of claim 1, wherein the semiconductor layer includes a dielectric material having the perovskite crystal structure as a base material and a metal dopant.

6. The capacitor of claim 5, wherein the dielectric material of the semiconductor layer is the same as a dielectric material of the dielectric layer.

7. The capacitor of claim 5, wherein the metal dopant comprises at least one of La, Nb, Y, Fe, Cr, Ta, Co, or Sc.

8. The capacitor of claim 1, wherein a thickness of the semiconductor layer is greater than a thickness of the metallic layer.

9. The capacitor of claim 8, wherein a thickness of the semiconductor layer is five times or more a thickness of the metallic layer.

10. The capacitor of claim 1, wherein a thickness of the semiconductor layer is within a range of about 100 Å to about 300 Å.

11. The capacitor of claim 1, wherein the first ionic layer, as a whole, has cationic properties.

12. The capacitor of claim 11, wherein the first ionic layer comprises a cationic layer having the cationic properties and a first neutral layer having neutral properties.

13. The capacitor of claim 12, wherein at least one cation of the first ionic layer is the same as at least cation of at least one of the semiconductor layer or the metallic layer.

14. The capacitor of claim 11, wherein the first ionic layer comprises an A3B3O$_3$ (O: oxygen) composition, A3 is a trivalent or higher valency cation, and B3 is a tetravalent cation.

15. The capacitor of claim 1, wherein the first ionic layer has a perovskite crystal structure.

16. The capacitor of claim 1, wherein the first ionic layer comprises at least one of LaTiO$_3$, YTiO$_3$, DyTiO$_3$, or SmTiO$_3$.

17. The capacitor of claim 1, further comprising:

at least one second ionic layer between the dielectric layer and at least one of the first electrode and the second electrode, the at least one second ionic layer having different ionic properties from the first ionic layer.

18. The capacitor of claim 17, wherein the at least one second ionic layer has a perovskite crystal structure.

19. The capacitor of claim 17, wherein the at least one second ionic layer comprises an anionic layer having anionic properties and a second neutral layer having neutral properties.

20. The capacitor of claim 17, wherein the at least one second ionic layer comprises an A4B4O$_3$ (O: oxygen) composition, A4 is a monovalent or higher valency cation, and B4 is a tetravalent cation.

21. The capacitor of claim 17, wherein the at least one second ionic layer comprises at least one of LiTiO$_3$, NaTiO$_3$, KTiO$_3$, RbTiO$_3$, LiZrO$_3$, NaZrO$_3$, KZrO$_3$, RbZrO$_3$, LiHfO$_3$, NaHfO$_3$, KHfO$_3$, or RbHfO$_3$.

22. The capacitor of claim 1, wherein the dielectric layer comprises at least one of BaTiO$_3$, KNbO$_3$, KTaO$_3$, PbTiO$_3$, PbZrO$_3$, SrTiO$_3$, CaTiO$_3$, SrHfO$_3$, or SrZrO$_3$.

23. The capacitor of claim 1, wherein the dielectric layer has a superlattice structure in which two or more dielectric materials having different dielectric characteristics from each other are repeatedly stacked.

24. A semiconductor device comprising:

the capacitor of claim 1.

25. The semiconductor device of claim 24, further comprising:

a transistor electrically connected to the capacitor.

26. The semiconductor device of claim 24, wherein the dielectric layer is a resistance changing layer.

\* \* \* \* \*